(12) United States Patent
Osawa et al.

(10) Patent No.: US 6,476,551 B1
(45) Date of Patent: Nov. 5, 2002

(54) LED ARRAY HEAD AND MINUTE REFLECTION OPTICAL ELEMENTS ARRAY FOR USE IN THE LED ARRAY HEAD

(75) Inventors: Yasuhiro Osawa; Tetsuro Saito; Shoichi Akiyama, all of Sendai (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/240,859

(22) Filed: Feb. 1, 1999

(30) Foreign Application Priority Data

Jan. 30, 1998 (JP) ............................................. 10-019227
Feb. 13, 1998 (JP) ............................................. 10-031065
Feb. 24, 1998 (JP) ............................................. 10-042203

(51) Int. Cl.[7] ............................................. H05B 33/12
(52) U.S. Cl. ........................ 313/506; 313/512; 362/241
(58) Field of Search ................................ 313/506, 503, 313/504, 512, 509, 498, 112, 113; 315/169.1, 169.3; 362/241, 297

(56) References Cited

U.S. PATENT DOCUMENTS

| | | | | | |
|---|---|---|---|---|---|
| 4,670,690 | A | * | 6/1987 | Ketchpel | 313/505 |
| 5,093,768 | A | * | 3/1992 | Ohe | 313/512 |
| 5,661,371 | A | * | 8/1997 | Salerno et al. | 313/169.3 |
| 5,910,706 | A | * | 6/1999 | Stevens et al. | 313/498 |
| 6,091,194 | A | * | 7/2000 | Swirbel et al. | 313/498 |
| 6,091,195 | A | * | 7/2000 | Forrest et al. | 313/504 |

\* cited by examiner

*Primary Examiner*—Vip Patel
*Assistant Examiner*—Joseph Williams
(74) *Attorney, Agent, or Firm*—Oblon, Spivak, McClelland, Maier & Neustadt, P.C.

(57) ABSTRACT

The present invention relates to a LED array head which includes a base plate, and an array of protruding LED light-emitting portions formed on the base plate. Further, a mirror array including reflection mirror structures is formed on an upper circumferential surface of corresponding LED light-emitting portions, thereby narrowing a radiation angle of light emitted by the corresponding light-emitting portions. In addition, the reflection mirror structures have a circular cone frustum shape with a diameter at an upper emission side larger than a diameter at a lower emission side. The present invention also relates to a minute reflection optical elements array of an optical writing apparatus having an array of light-emitting elements formed on a base plate of an LED array head. The optical elements array includes opening portions having a tapering cross-section shape which becomes narrower in a direction toward the base plate at sides opposing corresponding light-emitting elements. In addition, the corresponding opening portions are disposed over the corresponding light emitting elements. The minute reflection optical elements array also includes marginal escape recess portions formed at a surface of the optical elements array to be joined with a surface of the base plate of the array of light-emitting elements. The marginal escape recess portions have a shape corresponding to a shape of a wiring portion on the surface of the array of light-emitting elements at sides of the corresponding light-emitting elements. The present invention further described a method of making the devices described above.

5 Claims, 10 Drawing Sheets

LED ARRAY HEAD AND MINUTE REFLECTION OPTICAL ELEMENTS ARRAY FOR USE IN THE LED ARRAY HEAD

BACKGROUND OF THE INVENTION

1. Field of the Invention

The present invention relates to an LED array head and a minute reflection optical elements array for use in the LED array head. In particular, the present invention relates to an LED array head used as a light source of an LED array printer and a minute reflection optical elements array for use in the LED array head. The printer includes an optical writing apparatus, such as a LED array printer utilizing an electrophotographic process. The present invention further relates to a method of making the LED array head and the minute reflection optical elements array.

2. Discussion of the Background

The LED array printer using an electrophotographic process with an LED array head as its light source has a merit that deformation of the optical system due to vibration or heat is very small compared with a laser printer using a laser raster system.

FIG. 4 shows an outline of a basic structure of such an LED array printer. In FIG. 4, the LED array printer is constructed so that light rays emitted from an LED array head 100 are focused on a surface of a photosensitive body 102 (e.g., a photosensitive drum) through an equal-scale focusing optical system 101. Thereby, the photosensitive surface of the photosensitive body is exposed by the focused light rays and an electrostatic latent image is formed thereon.

One example of the LED array head 100, which has already been proposed, is shown in FIG. 5. In FIG. 5, an array of LED light-emitting portions 111 are formed so as to protrude from a surface of a silicon base plate 110 by causing the chemical compound semiconductor to grow in the low-cost silicon base plate 110 used as a head base plate (see Japanese Laid-open Patent Publication No. 9-45955/1997).

In the LED array 100, respective LED light-emitting portions 111 include plural semiconductor layers electrically connected to individual electrodes 112 and a common electrode 113 both formed on the silicon base plate 110. The light emitted from the respective LED light-emitting portions 111 is focused on the photosensitive body 102 through the equal-scale focusing optical system 101.

As shown in FIG. 6, the light-emitting portion 111 is formed so as to protrude from the silicon base plate 110. Thus, light is radiated directly towards the equal-scale optical system 101. However, light is also radiated from a side surface of the respective LED light-emitting portions 111 in a direction of a surface of the base plate (hereinafter referred to as "side surface light"). This radiated light is reflected by the respective LED light-emitting portions 111, the individual electrodes 112, the common electrode 113, or by a bonding wire for the individual electrodes 112. The light reflected is radiated toward the photosensitive body 102 as light-emitting points. Therefore, a latent image is formed on the photosensitive body 102 and which includes the side surface light (i.e., a noise component). After the latent image is developed, the developed image is transferred onto paper as a toner image. Consequently, there is a deterioration of image quality, such as an unevenness of line width on the image.

For example, background art Japanese Laid-open Patent Publication No. 6-25244/1994 has already proposed that a light-intercepting film be provided on side surface portions of the respective LED light-emitting portions 111. The light-emitting portions 111 are formed to have a protruding shape by growing and laminating (four-layer) semiconductor layers: 114$a$, 114$b$, 114$c$ and 114$d$ on the silicon base plate 110 (see FIG. 6). The electric current flows from the individual electrodes 112 to the common electrode 113. The individual electrodes 112 and common electrode 113 are respectively formed on upper and lower surfaces of the silicon base plate 110. Thereby, the light-emitting portions 111 emit light. In this example, the essentially desired light to be emitted is emitted from the upper surface 111$a$ of the respective LED light-emitting portions 111. However, a side surface 111$b$ of the LED light-emitting portion 111 also emits light. Thus, this side-surface light is suppressed by forming a reflective film (i.e., light intercepting film) with a protection film 115. The proposed LED array head of the background art as mentioned above adopts such a structure.

However, a problem exists with this structure because a part of the light is transmitted through a reflection film 116. Even though this transmitted light is faint, the light exerts a negative influence on an exposure pattern on a surface of the photosensitive body 102. Therefore, it is necessary to use a thin film compound of material having a sufficient effect of intercepting the light as the reflection film 116 (e.g., metal) instead of a transparent material such as an oxide compound (oxided substance).

Here, as the method of forming the metal reflection film, a material having an anisotropic property in an film forming direction is generally used. As shown in FIG. 6, the shape of the side surface of the LED light-emitting portion 111 in the array direction thereof is constricted in a shape of a 90°— inclined letter V, "<", or in the shape of a reversed mesa. Therefore, if the side surface 111$b$ of the LED light-emitting portion 111 is vertical or has an overhang of a reversed-mesa shape it is inevitably necessary to adopt a film forming process of inclining and piling the base plate, etc. Thus, the process of assembling the LED array head is complicated. This is a problem to be solved.

Furthermore, to avoid a short-circuit between the conductive metal electrodes, it is necessary to insulate the individual electrodes and the light intercepting film with an insulating film. Thus, the number of processes inevitably increases.

In addition, radiated light has a property of a wide radiation angle. Therefore, it is difficult to effectively direct the radiated light into the equal-size focusing optical system 101 in FIG. 4. In addition, the essential light is first directed into the equal-size focusing optical system 101 and then radiated to expose the photosensitive body 102. Therefore, it is desired to narrow the radiation angle thereof so that the light can be easily directed into the equal size-focusing optical system as incident light, and thereby a light combining efficiency can be improved.

In recent years, personal and office information apparatus have been largely developed. Therefore, a demand for a high resolution, compact, and inexpensive apparatus has been considerably raised, such as a printer using an electrophotographic process. As an apparatus satisfying such a demand, for instance, there exists an LED array printer using an LED array head having a large number of very small (miniature-sized) LED light-emitting elements arranged in a state of an array on a base plate. Since an LED array printer is a solid-state scanning type printer using the LED array head as the writing light source, it is possible to easily make the apparatus small-sized, compared the raster scanner type laser printer utilizing the semiconductor laser. Furthermore, because the respective LED light-emitting elements in the LED array head perform the writing operation in parallel, it is possible to have high-speed output, especially compared with the raster scanner type laser printer. The LED array printer has the merits as mentioned above.

Another example of an LED array head has been proposed in Japanese Laid-open Patent Publication No. 6-125, 1114/1994. For example, referring to FIG. 10, the reference numeral 201 represents an LED array chip, in which an LED light-emitting element 202, a bonding pad 203, etc. are formed. The LED array chip is mounted on a base plate 204 together with a driver IC (not shown), etc. The LED array chip 201 is constructed such that an electric current is supplied so as to flow between the bonding pad 203 on the LED array chip 201 and a bonding pad 205 disposed on a surface of the base plate via a bonding wire 206 connected therebetween.

In addition, the LED light-emitting element 202 is connected to the bonding pad 203 via a wiring pattern not shown. The light emitted from the LED light-emitting element 202 In an LED array head 207 is focused and radiated onto the surface of a photosensitive body 209 (e.g., drum) through an equal-size focusing optical system 208. Thereby, the photosensitive surface is exposed by the focused and radiated light and an electrostatic latent image is formed thereon. In general, as the equal-size focusing optical system 208, a lens array having a refractive index distribution type fiber is used.

However, in the LED array head 207, the light directed into the equal-size focusing optical system 208 includes incident light from areas excluding the essential light-emitting area. Such undesirable light results in the deterioration of the image quality. For instance, a part of the emitted light is reflected by the bonding wire 206. This reflected light enters into the area of visual field θ of the equal-size focusing optical system 208. Thus, the light is radiated as unnecessary light on a light spot on the surface of the photosensitive body 209 or as vacillating light. As a result, the image quality is lowered. In addition, sometimes areas of the base plate 204, in which light should not be emitted from, emit light due to an abnormal state of a process at a time of creating light emission. Concerning this point, the LED array printer using the LED array head as the writing light source has a relatively low resolution, e.g., 400 dpi. Therefore, the influence exerted by such vacillating light is not such a serious problem. However, in recent years, a high resolution apparatus (e.g.,600 through 1,200 dpi) has been realized. Therefore, it is impossible to disregard the above-mentioned matters as one of the reasons of lowering the image quality.

As a method of preventing the lowering of the image quality due to the light radiated from areas excluding that of the LED light emitting element, the Japanese Laid-open Patent Publication No. 4-179,1558/1992, has proposed a method of coating all of the areas excluding that of the LED light-emitting element with paints exhibiting a light intercepting effect. If such method is applied also for the bonding wire, light reflected by the bonding wire can be reduced.

However, because a surface of the light intercepting paints has some amount of a reflection coefficient, the reflected light on this position cannot be completely eliminated. As discussed above, for a background LED array printer having low resolution, this is not such a serious problem. However, in the LED array printer having a high resolution developed in recent years, even a small amount of unnecessarily reflected light exerts a negative influence on the image. Therefore, the image quality is inevitably lowered. The method of preventing the negative influence due to this reflected light by use of the light intercepting paints is insufficient for solving such a problem arising in the recent high-resolution LED array printer.

Furthermore, even though the above method is somewhat effective, there is a limitation in a weather-proof characteristic of the coatings (e.g., paints) used. Namely, when the LED array printer is used for a long time, the surface of the light intercepting paints is deteriorated, which results in a rough surface. Consequently, the surface of the paints becomes white to some extent. As a result, the reflection coefficient gradually increases, and thereby the effect initially desired cannot be obtained.

SUMMARY OF THE INVENTION

One object of the present invention is to solve the above-mentioned problems.

Another object of the present invention is to provide an optical apparatus using an LED array head capable of solving the above-mentioned problems.

Yet another object of the present invention is provide an LED array head which suppresses the negative influence caused by side surface light emitted from side surfaces of the protruding LED light-emitting portions and to narrow the radiation angle of essential light emitted from the upper surfaces of the LED light-emitting portions. Thus, the efficiency of combining light with the equal-size focusing optical system is improved.

Still another object of the present invention is to provide a minute reflection optical element array, preferable for a high resolution writing operation performed by an image forming apparatus.

Another object of the present invention is to provide a minute reflection optical element array, preferable for a high resolution writing operation, without lowering an image quality due to light emitted from areas other than an essential light emitting area.

These and other objects are achieved by providing an LED array head which includes a base plate, and an array of protruding LED light-emitting portions formed on the base plate. Further, a mirror array including reflection mirror structures is formed on an upper circumferential surface of corresponding LED light-emitting portions, thereby narrowing a radiation angle of light emitted by the corresponding light-emitting portions. In addition, the reflection mirror structures have a circular cone frustum shape with a diameter at an upper emission side larger than a diameter at a lower emission side. Also provided is a minute reflection optical elements array of an optical writing apparatus having an array of light-emitting elements formed on a base plate of an LED array head. The optical elements array includes opening portions having a tapering cross-section shape which becomes narrower in a direction toward the base plate at sides opposing corresponding light-emitting elements. In addition, the corresponding opening portions are disposed over the corresponding light-emitting elements. The minute reflection optical elements array also includes marginal escape recess portions formed at a surface of the optical elements array to be joined with a surface of the base plate of the array of light-emitting elements. The marginal escape recess portions have a shape corresponding to a shape of a wiring portion on the surface of the array of light-emitting elements at sides of the corresponding light-emitting elements. Also provided is a method of making the devices described above.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
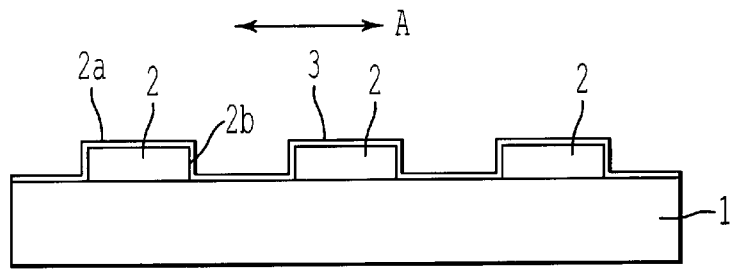
FIGS. 1A–1E are cross-sectional views showing a method of making an LED array head according to a first embodiment of the present invention.

Referring to the attached drawings, the preferred embodiments of the present invention are described in detail hereinafter. The present invention is briefly classified into five aspects.

The first aspect of the invention relates to an LED array head including plurality of LED light-emitting portions formed in a state of array so as to protrude from a head base plate. The LED array head includes a mirror array having reflection mirror structures formed therein. The mirror structures respectively correspond to an upper circumferential surface of respective LED light-emitting portions. Therefore, the radiation angle of emitted light is narrowed.

In such a structure, even though light is radiated from a side surface of the protruding LED light-emitting portions, the light is intercepted on a rear surface of the respective reflection mirror of the mirror array. Because the light is reflected back to the base plate, the light is not emitted outwards. Thereby, the unfavorable influence due to side surface light can be suppressed.

In addition, essential light emitted from the upper surface of the protruding LED light-emitting portion is reflected off an outer surface of the reflection mirror towards a focusing system, for example. Consequently, the radiation angle thereof may be substantially narrowed, and the efficiency of combining the light with the equal-size focusing optical system, etc., is improved.

The second aspect of the invention relates to an LED array head having reflection mirror structures formed in a shape of circular cone frustum such that an upper surface has a diameter larger than a diameter of a lower surface.

In the second aspect, the reflection mirror structure for narrowing the radiation angle can be simply and easily manufactured in such a shape as mentioned above. Thus, a desirable function can be ensured. It is also possible that the reflection mirror structure forms a ring-shape, for instance, by cutting away a part of a spherical surface.

The shape and size, etc., of the mirror array is determined in consideration of a size of the LED light-emitting portion, an incident visual field angle, and the easiness of manufacturing it.

The third aspect of the invention relates to a minute reflection optical elements array assembled in an optical writing apparatus provided with a light-emitting elements array. The light-emitting elements array includes plural light-emitting elements linearly formed on a base plate, the light emission of which each is individually controlled. In addition, the reflection array is disposed at positions adjacent to the light-emitting elements array, and includes opening portions having a tapering cross-section shape. That is, a tapering cross-section shape which becomes narrower towards a surface of the base plate, so as to correspond to the respective light-emitting elements.

In such a structure, the essential light emitted from the respective light-emitting elements respectively pass through the corresponding opening portions and then is directed to an essential direction. In addition, even though light is emitted from areas other than the essential light-emitting area (e.g. due to side surface light), this light is reflected on the surfaces of the corresponding opening portions. Thereby, the light can be guided to a same direction as that of the essential light. Consequently, the existence of irregular vacillating light is removed, and there is not a negative influence on the image to be written.

The fourth aspect of the invention in connection with the third aspect relates to the minute reflection optical elements array, in which a marginal escape recess portion is formed. The marginal escape recess portion includes a shape corresponding to a shape of a wiring portion on the light-emitting elements array. Further, the recess portion is formed on a surface of an optical element base plate at a side of the light-emitting elements array.

The minute reflection optical elements array is mounted on the light-emitting elements array at an adequate interval or in the state of being closely adhered thereto. The mounting is performed by bonding the former to the latter with an adhesive agent, such as an ultraviolet hardening resin, etc. In addition, at a side of the light-emitting elements array, the wiring pattern may be disposed on positions just adjacent to the light-emitting area.

For the case of mounting the minute reflection optical elements array, the sharp step caused by the wiring pattern may become a hindrance (obstacle). Furthermore, there arises a fear that, if the adhesion layer such as the ultraviolet hardening resin is too thick, the precision of the mounting position may be lowered (deteriorated) in the manufacturing process and the time period required for positioning may become longer.

However, because the marginal escape recess portions corresponding to the shape of the wiring portions on the light-emitting elements array are respectively formed on the surface of the optical element base plate, the minute reflection optical elements array can be easily mounted on the light-emitting elements array, without being affected by the wiring portions.

The fifth aspect of the invention in connection with the third or fourth aspects relates to the minute reflection optical elements array in which a thin film or a substrate of the thin films is formed on the surface of the opening portions, and in which the thin film is made from a metal material selected from the group of aluminum, titanium, gold, silver, tungsten, nickel, or chromium.

In such a structure, the essential light emitted from the respective light-emitting elements pass through the respective corresponding opening portions and the essential light is directed outwards. The other light coming from areas excluding the essential light emitting area (i.e., due to light reflected from side surfaces of the light-emitting elements array) can be surely guided in the same direction as that of the essential light by the reflection layer formed on the surface thereof. Thus, this other light is effectively guided to the equal-size focusing, optical system, etc.

Consequently, the amount (intensity) of the light to be written increases and thereby the further high-speed writing operation can be realized, In addition, the brightness of the image also increases due to the increase of the amount light written, and therefore the photosensitive body having a lower sensitivity may be used.

First Embodiment

The first embodiment according to the present invention will now be described with reference to FIG. 1 and FIG. 2. The LED array head of the first embodiment includes a head base plate 1 made with GaAs, for example. In addition, a semiconductor layer film is formed on the surface of the GaAs base plate 1. By etching the semiconductor layer film into a suitable pattern, an array of protruding LED light-emitting portions 2 may be formed. The array direction is defined by the arrow A in FIG. 1A (i.e., left and right directions).

Each of the LED light-emitting portions 2 may be formed, for example, as a pattern have a size of approximately 10 $\mu m \times 10 \mu m$ and a thickness of almost 44 $\mu m$. In addition, a surface of the GaAs base plate 1 including the LED light-emitting portions 2 is entirely coated with a transparent $SiO_2$ film 3 as an insulation film (see FIG. 1A).

Figure 1B:
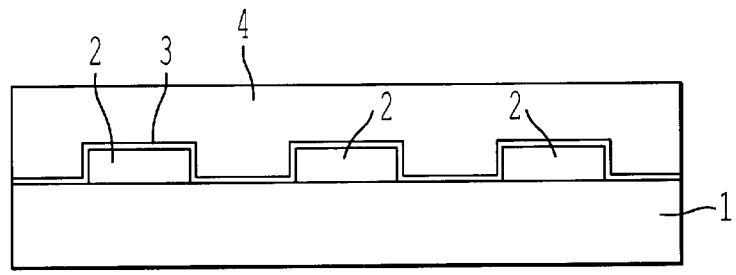
Figure 1C:
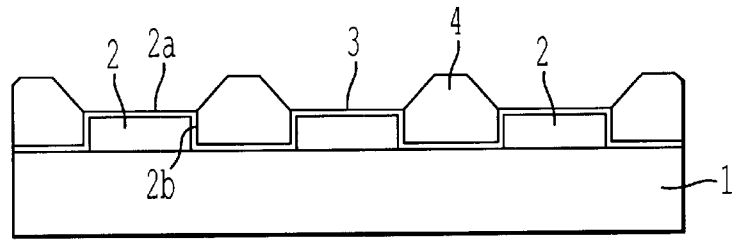
Figure 1D:
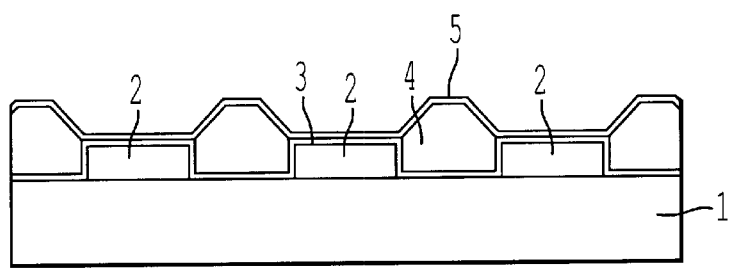
Figure 2:
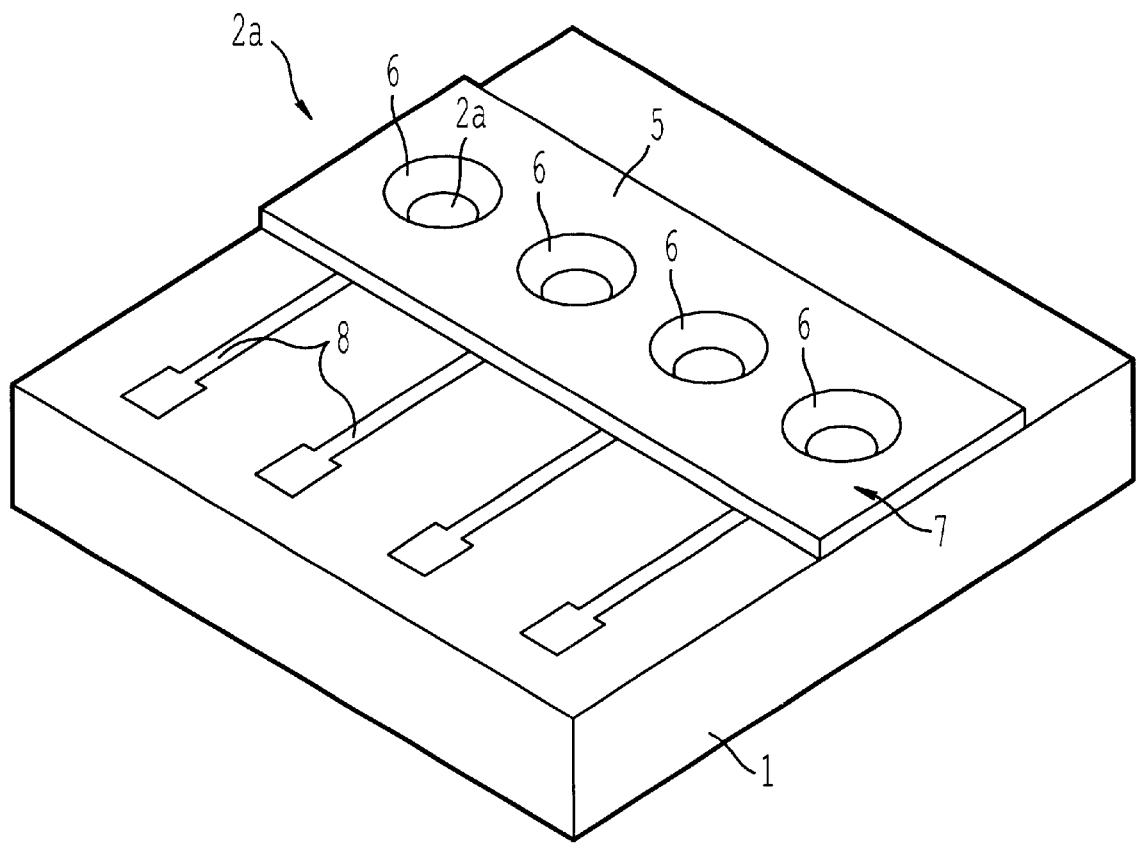
FIG. 2 is a perspective view showing the LED array head according to the first embodiment.

Next, the surface of the GaAs base plate 1 is applied (covered) with a polyamide film 4, and thereby the surface becomes flat (see FIG. 1B). The thickness of the polyamide film 4 on the GaAs base plate 1 is, for example, approximately 30 $\mu m$.

Then, the polyamide film 4 on sides of respective LED light-emitting portions 2 is etched into a circular conical frustum shape. Thus, an upper surface portion 2a is exposed and a circumference of a side surface 2b is covered with the polyamide film 4 (see FIG. 1C). In addition, the diameter of an upper part (enlarged portion) of the circular conical frustum shape is made, for instance, to be almost 26 $\mu m$. Further, an aluminum film 5 is vacuum-evaporated on the entire etched surface to approximately a 500 nm film thickness (see FIG. 1D).

Figure 1E:
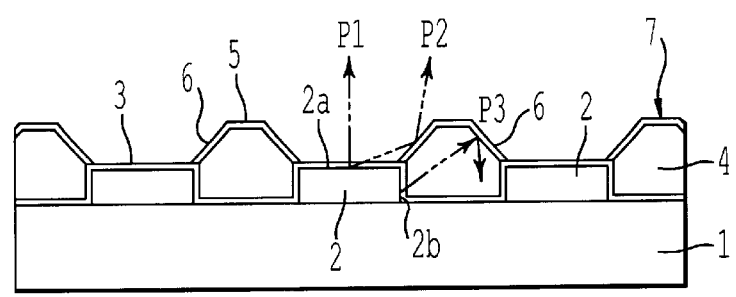

Thereafter, the aluminum film 5 on the upper surface 2a of the respective LED light-emitting portions 2 is removed by etching. Thus, a reflection mirror structure 6 of the circular conical frustum shape formed with the aluminum film 5 can be realized. The mirror array 7 corresponds to the circumference on the upper surface 2a of the respective LED light-emitting portions 2, as shown in FIG. 1E and FIG. 2. The reference numeral 8 in FIG. 2 represent individual electrodes individually drawn out from the respective LED light-emitting portions 2. Furthermore, although the common electrode is not shown, the common electrode is formed on the rear surface side of the GaAs base plate 1.

In such a structure as mentioned above, the light P1 (light having a small radiation angle) is emitted from the upper surface 2a of the LED light-emitting portions 2 with an almost vertical angle. The light P1 is directed to an equal-size focusing optical system as incident light through the $SiO_2$ film 3. Thus, directed light is radiated onto the surface of the a photosensitive body. Furthermore, light P2 emitted from the upper surface 2a and having a large radiation angle is reflected by the aluminum film 5 of the reflection mirror structure 6. Thereby, the reflected light P2 is directed to the equal-size focusing optical system as incident light and the radiation angle thereof is narrowed. The light thus directed is radiated onto the surface of the photosensitive body.

Consequently, even though the radiation angle of the light emitted from the LED light-emitting portions 2 is wide to some extent, the reflection mirror structure 6 is utilized, and thereby the radiation angle is substantially narrowed. Therefore, the efficiency of combining the light for the equal-size focusing optical system from the LED array head can be improved.

In addition, the unnecessary side surface light P3 radiated from the side surface 2b of the protruding LED light-emitting portion 2 is directed into the polyamide 4 as incident light. Thus, this light is reflected on a rear surface of the corresponding mirror structure 6 (aluminum film 5), and is further directed to the surface of the base plate 1. Consequently, the light is not emitted outwards and directed onto the photosensitive surface. Therefore, the negative influence due to the side-surface light P3 can be suppressed.

Second Embodiment

The second embodiment according to the present invention will now be described with reference to FIG. 3. In addition, an explanation of parts of the second embodiment having the same reference numeral as that of the first embodiment is omitted for simplicity purposes.

Although the LED array head of the second embodiment has basically the same structure as that of the LED array head of the first embodiment, the method of manufacturing the LED array head of the second embodiment is different from that of the first embodiment.

Figure 3A:
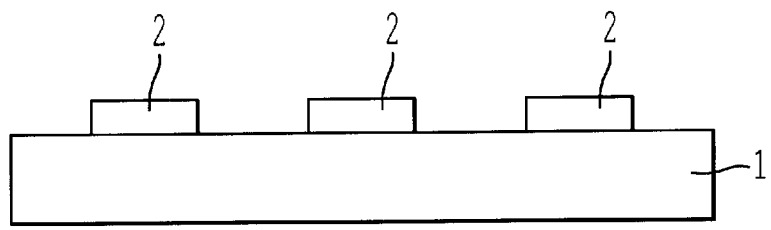
FIGS. 3A–3E are cross-sectional views showing a method of making the LED array head according to a second embodiment of the present invention.
Figure 3B:
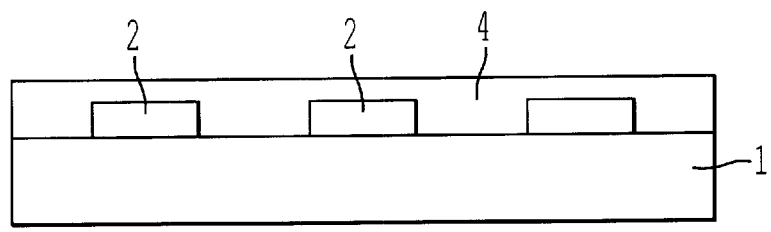
Figure 3C:
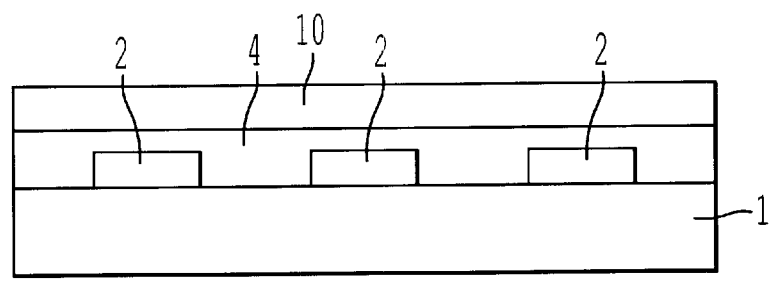
Figure 3D:
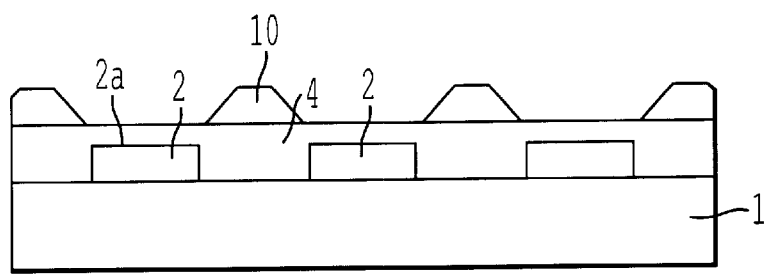
Figure 3E:
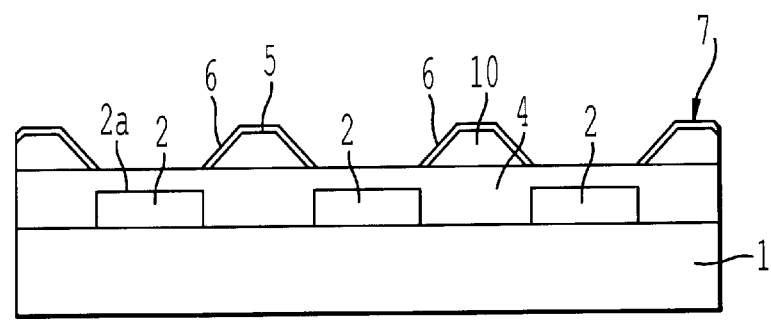
Figure 4:
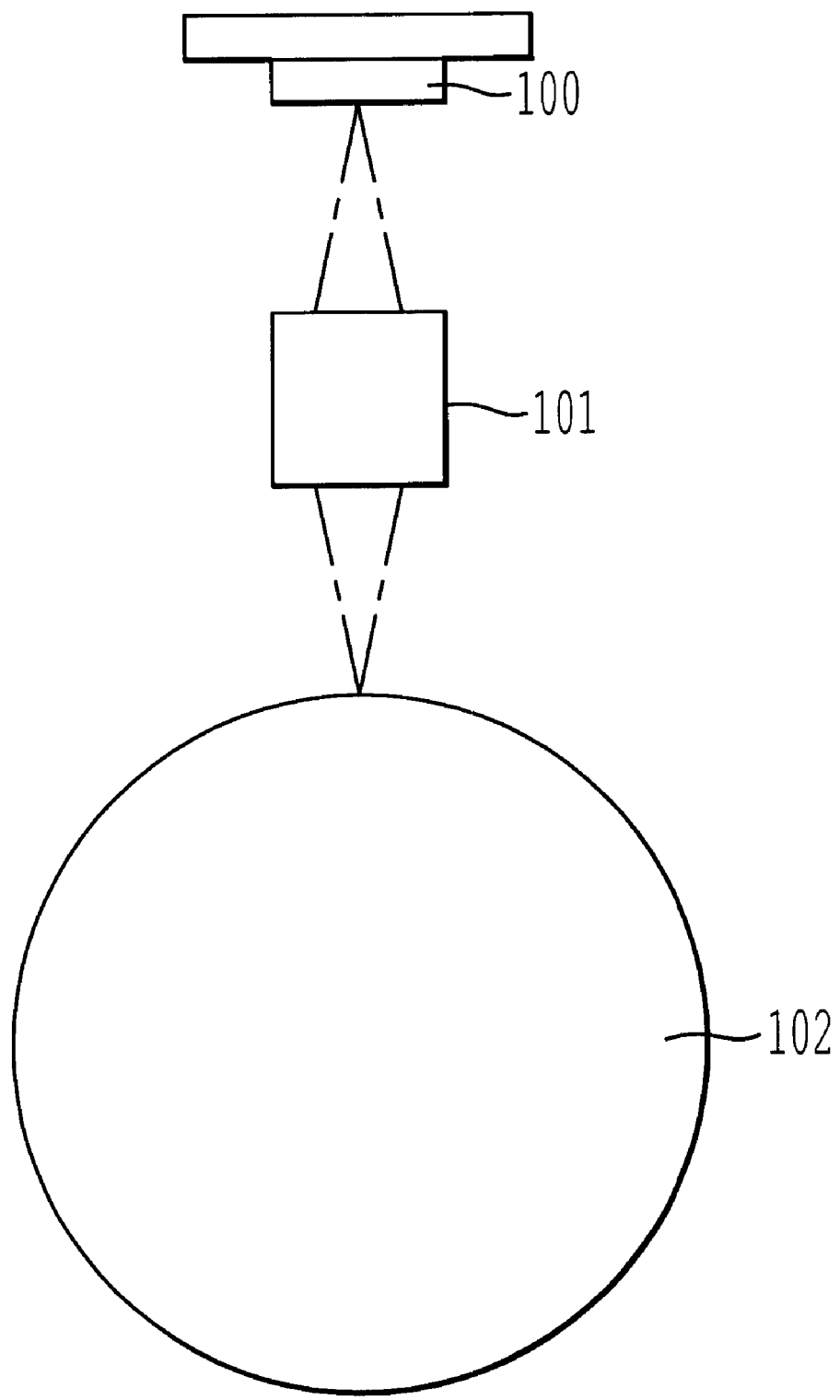
FIG. 4 shows a basic structure of an LED array printer.
Figure 5:
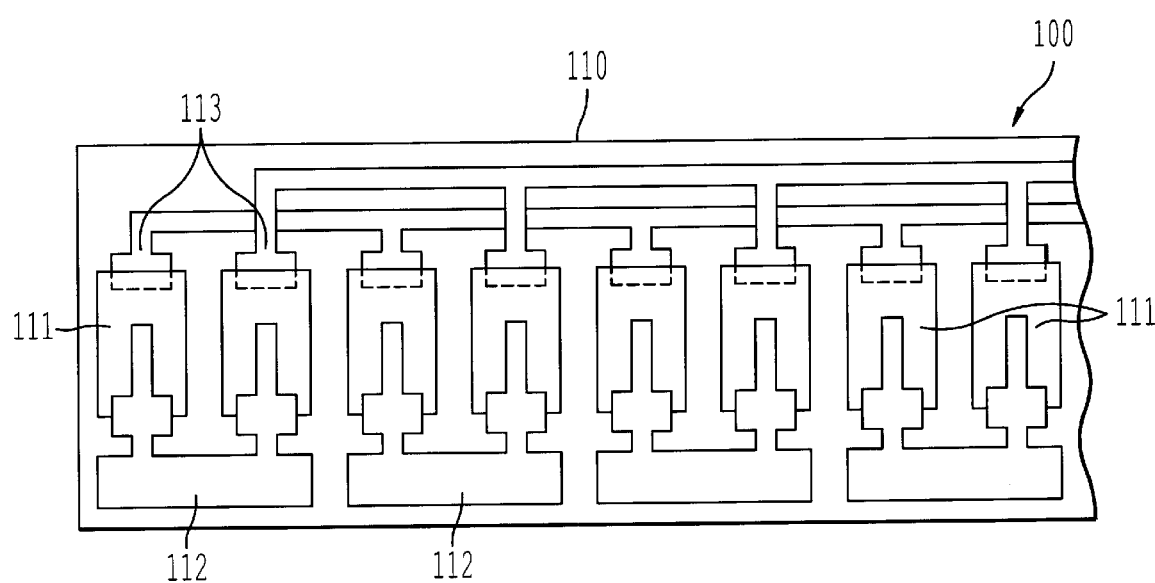
FIG. 5 is a plane view showing an example of a background art LED array head structure.
Figure 6:
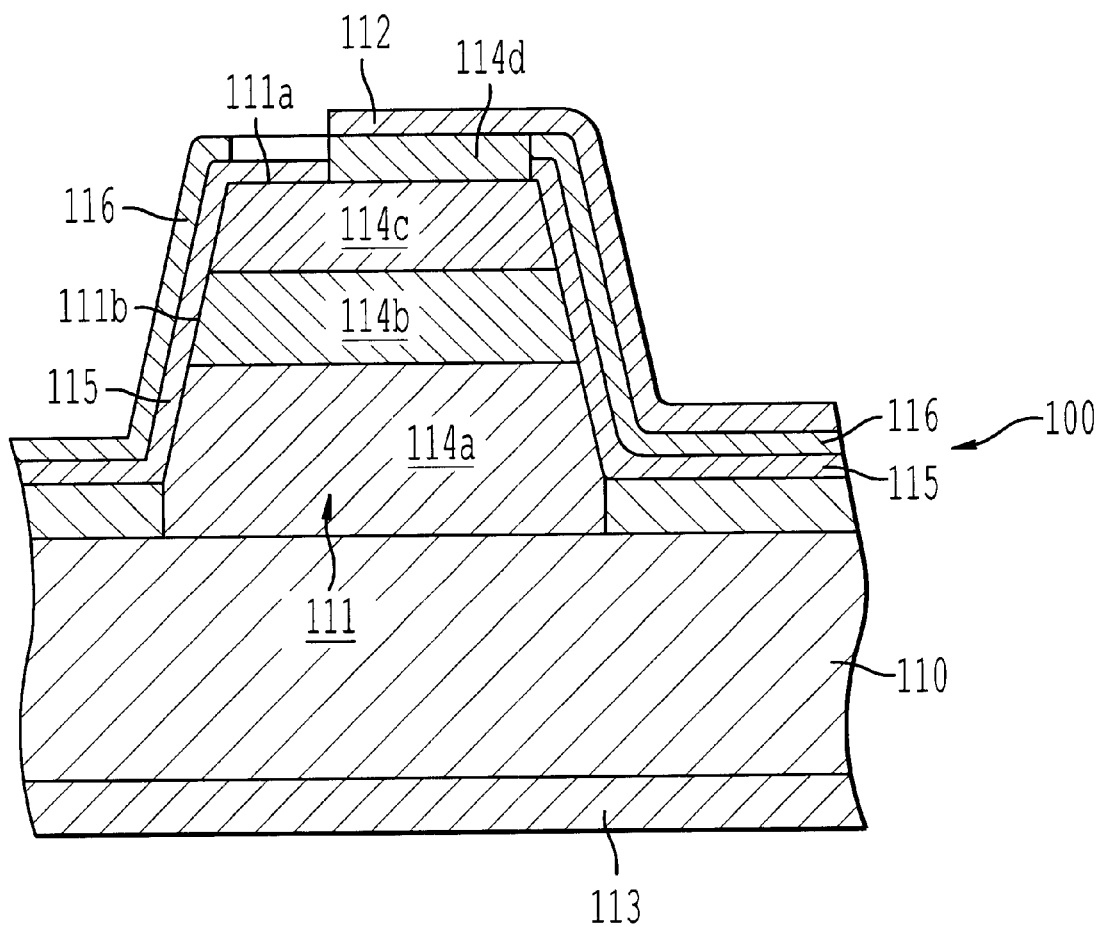
FIG. 6 is a cross-sectional view showing a background art light intercepting film structure.

First, the GaAs base plate 1 having the LED light-emitting portions 2 with the size of 10 $\mu m \times 10 \mu m$ and the thickness of 4 $\mu m$ is formed so as to protrude therefrom (see FIG. 3A). The surface thereof is coated with polyamide 4 and made flat (see FIG. 3B). The thickness of the polyamide film 4 on the GaAs base plate 1 is, for instance, approximately 5 $\mu m$. Furthermore, the polyamide film is uniformly coated with a photosensitive polyamide film 10, for instance, having a thickness of almost 25 $\mu m$ (see FIG. 3C).

Following the above steps, the photosensitive polyamide film 10 is exposed with light and developed by a photo lithographic method (i.e., photolithography). Thus, a recess portion of the circular conical frustum shape can be formed on an upper part of the respective LED) light-emitting portions 2 (see FIG. 3D). A diameter of the upper part (enlarged portion) of the circular conical frustum shape is made, for instance, to be approximately 26 $\mu m$.

Thereafter, as in the case of the first embodiment, the aluminum film 5 is a vacuum-evaporated on the entire surface thereof to have a film thickness of approximately 500 $\mu m$. Then, the aluminum film 5 on the upper surface portion 2a of the respective LED light-emitting portions 2 is removed by etching. Thus, the reflection mirror structure 6 with the aluminum film 5 can be realized. The mirror array 7 corresponds to a circumference of the upper surface 2a of the respective LED light-emitting portions 2.

The functional effect of narrowing the radiation angle and that of suppressing the negative influence due to reflection of side surface light of the second embodiment are respectively the same as the first embodiment.

Regarding the manufacturing method, while the $SiO_2$ film 3 is used as the insulation film in the first embodiment, the polyamide film 4 is commonly used as the insulation film and the surface smoothing film in the second embodiment. This is a different point between the first and second embodiments.

Here, the polyamide film 4 is liver-brown and absorbs light in the visible light area. However, because the polyamide film 4 on the upper surface 2a of the LED light-emitting portion 2 is very thin, for instance, a thickness of approximately 1 μm, the absorbing action for the light emitted from the upper surface 2a can be practically ignored.

Third Embodiment

Figure 10:
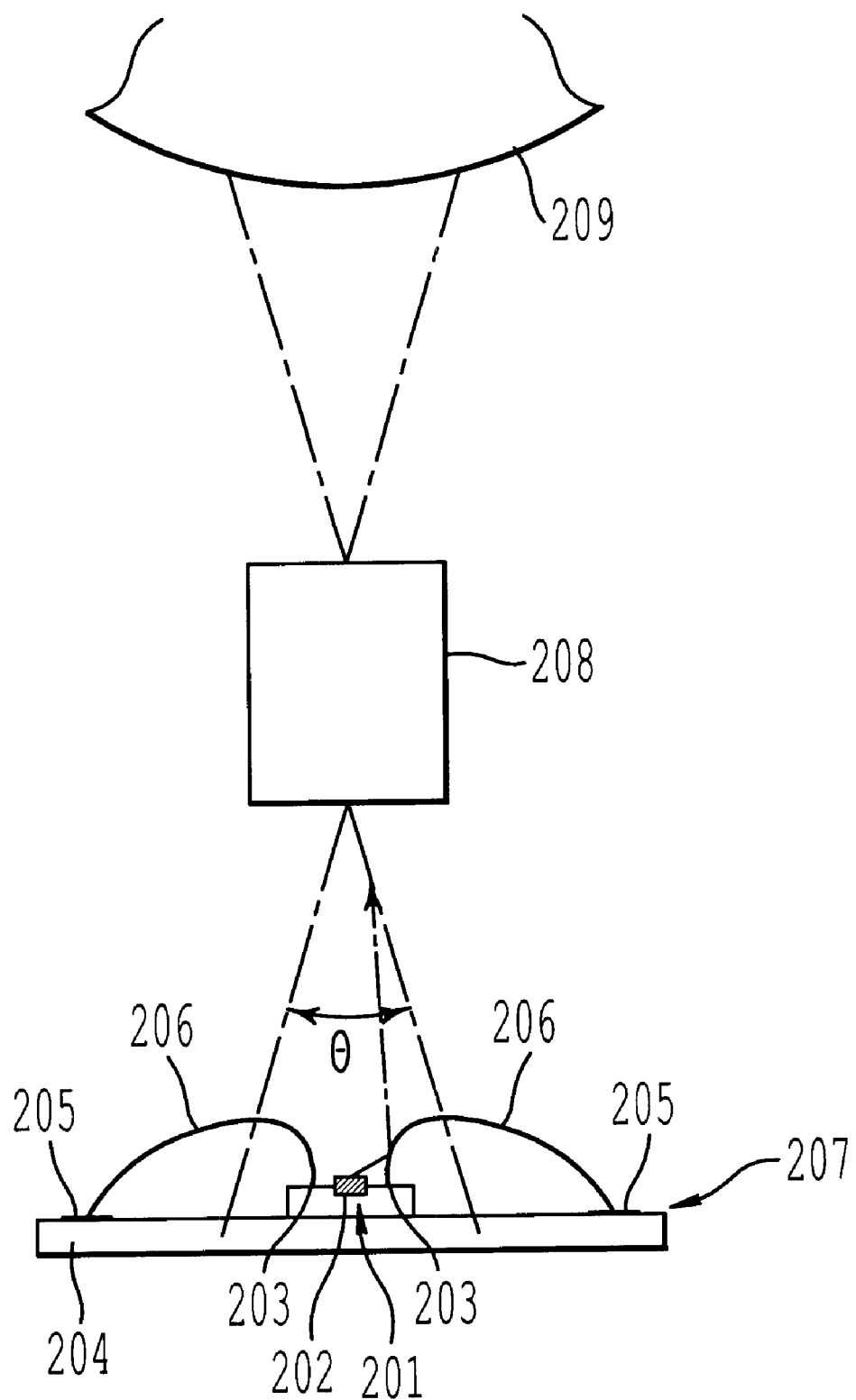
FIG. 10 is a side view showing a background apparatus in connection with a minute reflection optical elements array of the present invention.

The third embodiment according to the present invention will now be described with reference to FIG. 7 and FIG. 8. In the third embodiment, a minute reflection optical element array 211 is superimposed on a base plate 204 of an LED array head 207 in an LED array printer having the structure, for instance, as shown in FIG. 10. The minute reflection optical element array 211 includes opening portions 213 which have, for example, a polygon, circle, or square shape. In addition, the opening portions 213 taper towards a surface of the base plate 204, as shown, and are linearly arranged on an optical element base plate 212 and bored therethrough.

The opening portions 213 are formed so that a size and pitch of the opening portions 213 respectively coincide or almost coincide with a size and pitch of respective LED light-emitting elements 202, which are the light-emitting elements on the LED array chip 201. In addition, a reflection layer 214 is formed on a surface of each opening portion 213. It is preferable to use metal as a material for the reflection layer 214. However, the present inventors performed experiments to determine the adaptability of various industrially usable materials and found that the thin film (i.e., reflection layer 214) is preferably made with at least one of the metals selected from aluminum, titanium, gold, silver, tungsten, nickel, and chromium. Furthermore, regarding the material for the optical element base plate 212, it is preferable to use an opaque material for light emitted from the respective LED light-emitting elements 202. However, in the case of forming the reflection layer 214 on the surface of the base plate 212 as in the present embodiment, it may be allowable that the optical element base plate 212 is made of a transparent material. Therefore, the selection may be widened for selecting suitable material(s).

Figure 7:
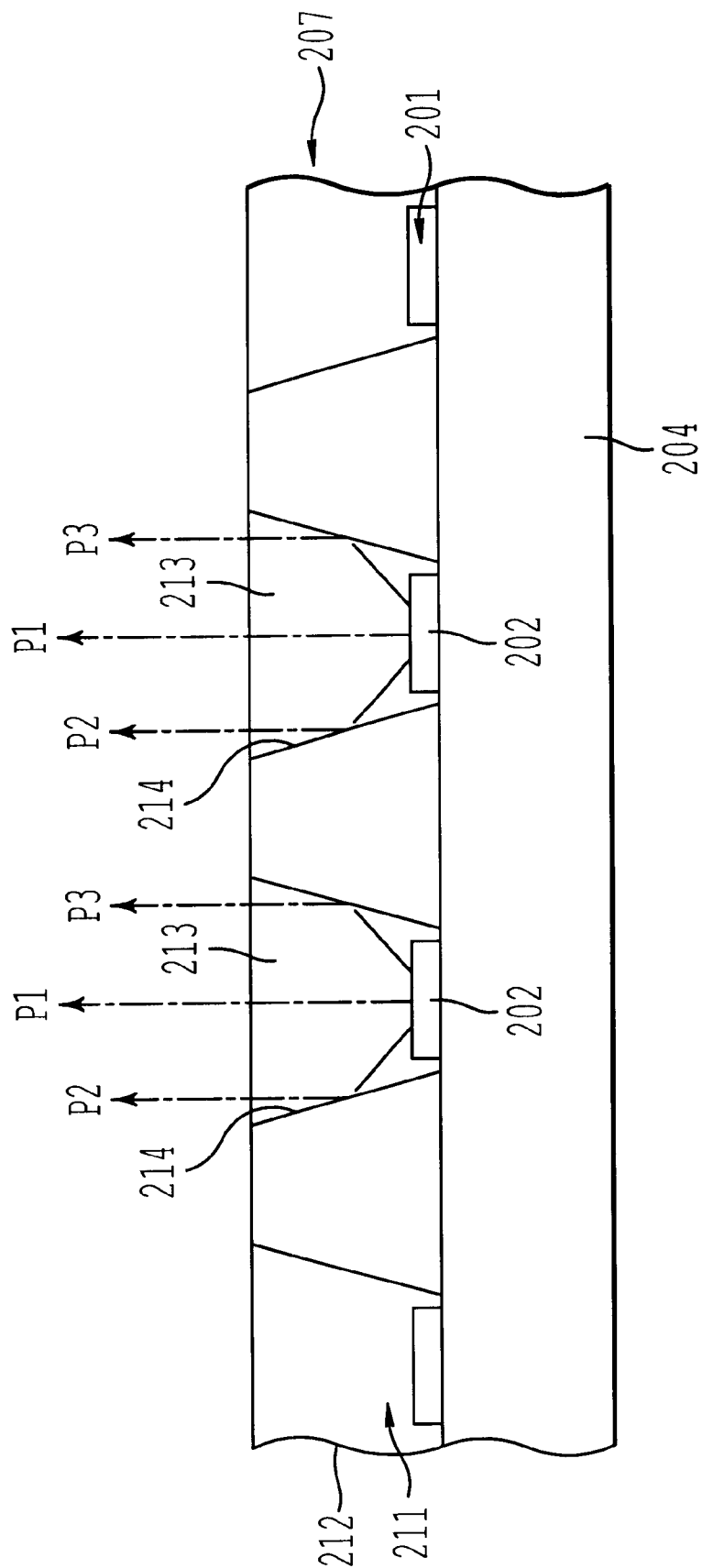
FIG. 7 is a cross-sectional view showing a minute reflection optical elements array according to a third embodiment of the present invention.
Figure 8:
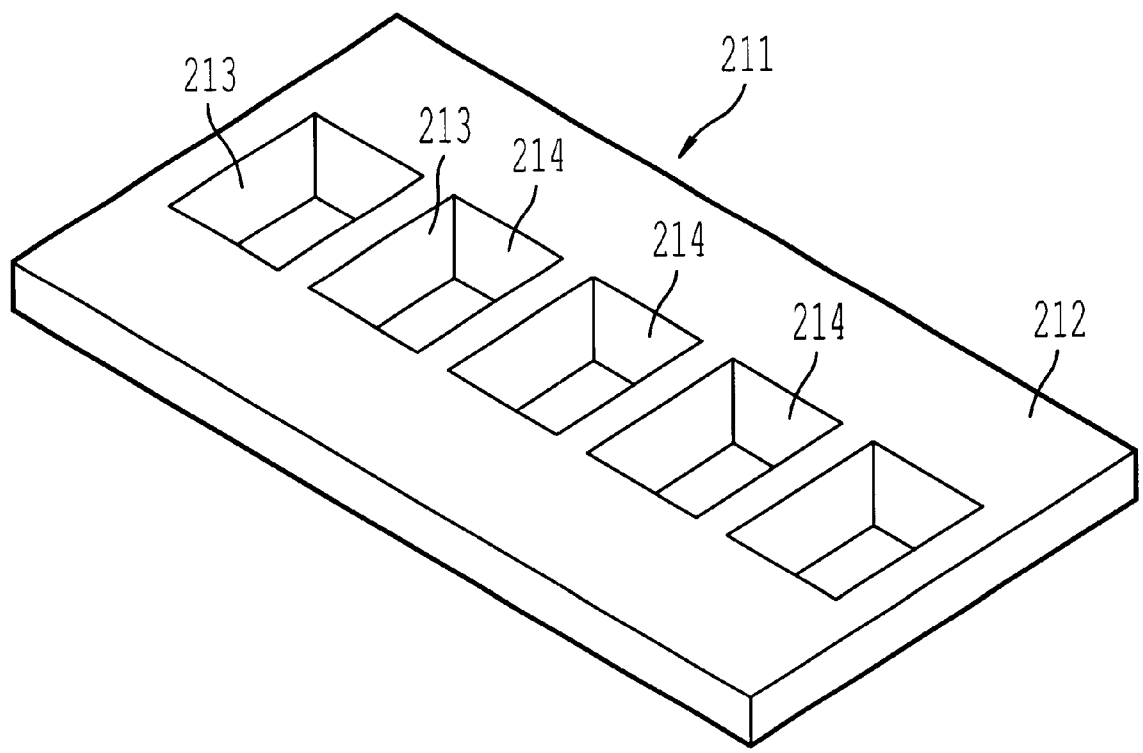
FIG. 8 is a perspective view showing a single minute reflection optical element of the third embodiments.

The minute reflection optical element array 211 is mounted with a suitable interval by the method of binding (bonding) the optical element array 211 onto the LED array chip 201 with an ultraviolet hardening resin, as shown in FIG. 7. Thereby, a part of the LED array head 207 can be constructed.

In such a LED array head 207 having the minute reflection optical elements array 211, essential light P1 emitted from the respective LED light-emitting elements 202 passes through the opening portions 213. Thus, the essential light P1 proceeds to the equal-size focusing optical system, etc. Even though light P2 or P3 emits from areas other than a desired light-emitting area of the respective LED light-emitting elements 202, the light P2 or P3 is reflected by surfaces of the opening portions 213. Therefore, the light P2 or P3 can be directed in a same direction as that of the essential light P1. Consequently, the light P2 or P3 does not become irregular vacillating light. Therefore, any negative influence is not exerted on the written image, contrary to the background art countermeasure of using light intercepting paints. In particular, in the present embodiment, since the reflection layer 214 is formed on the surfaces of the opening portions 213, the light P2 or P3 can be surely and effectively guided in the same direction as that of the essential light P1 to the equal-size focusing system as incident light.

Thus, the amount (intensity) of the light contributing to the image formation increases, and thereby the brightness of the image also increases. Consequently, the photosensitive body 209 (FIG. 10) having a rather low sensitivity can be used and a further high speed optical writing operation can be performed.

An example of a first concrete structure of the minute reflection optical elements array 211 will now be described with reference to FIG. 8. A quartz base plate (optical element base plate 212) is polished to obtain a thickness of approximately 40 μm, and a thermoplastic resin (not shown) is formed flat on the glass plate 212. Further, the quartz base plate 212 is coated a photoresist, such as the photoresist OFPR8600 manufactured by Tokyo Ohka Co., Ltd. The base plate 212 is coated using, for example, a spin-coat method so as to obtain a thickness of approximately 3 μm. In addition, a linearly arranged pattern having circular opening patterns with a diameter of approximately 20 μm and a pitch of 40 μm (corresponding to 600 dpi) is formed by baking on the photoresist. Then, the pitch of ordinary developing and rinse processes are practiced. In such a way, a resist mask, on which cylinders having a same shape are arranged, can be formed.

Here, a rear surface and a circumferential surface of the glass base plate are masked to prevent them from being corroded by the etching liquid. In addition, the etching operation is performed in the solution of dilute fluoric acid. The time period of etching is determined by observing a point of time when a base portion of the glass base plate is exposed.

By utilizing the fact that the diameter of the upper portion is enlarged by the undercutting process, it is possible to obtain the minute reflection optical element array having opening portions 213. The opening portions 213 are linearly formed and have an upper part diameter of approximately 30 μm and a lower part diameter of approximately 20 μm with a pitch of about 40 μm (i.e., the opening portions 213 have a shape which tapers). The tapering shape thereof is controlled by adjusting the temperature of the etching liquid, the density of the dilute fluoric acid, and the frequency of the agitating operation.

Next, while maintaining a sticking state of the thermoplastic resin on the glass plate, the etching mask is removed. In such a state, gold (Au) with a thickness of approximately 7000 Å is vacuum-evaporated on a surface of the glass base plate (i.e., the surface of the glass base plate having opening portions 213 with the diameter of 20 μm) by use of a vacuum evaporating apparatus. Thereafter, the glass plate is taken away from the quartz class base plate by heating and the base plate side of the quartz glass is cleaned with the organic solution. Thereby, the thermoplastic resin is removed. In such a way, the minute reflection optical elements array 211 having the reflection layer 214 formed thereon can be completed.

To determine the function of the minute reflection optical element array 211, a light Writing apparatus, as shown in FIG. 10, was manufactured. Here, the equal-size focusing optical system 208 used was the SLA12D made by Nihon Itagarasu Co., Ltd.

Furthermore, regarding the LED array head 207, gallium-arsenic crystal layer is grown on a silicon wafer (base plate) by a heteroepitaxial method. Thereafter, zinc (Zn) is diffused into the gallium-arsenic crystal layer for forming a POLY-NUCLEOTIDE junction. The gallium-arsenic crystal layer is dry-etched by a chlorine gas. In addition, the patterning operation is performed so that square-pillar-shaped crystal layers are formed having a size of about 10 μm×10 μm with a pitch of 40 µm (corresponding to 600 dpi). Thereby, a large number of LED light-emitting elements 202 may be formed in the state of an array.

Following the above-mentioned steps, a silicon oxide film having a thickness of about 5000 Å is formed as the insulation film on the entire surface of the light-emitting elements. Thereby, a contact hole is formed. Then, a wiring pattern is formed with aluminum for the LED light-emitting elements 202, and bonding pads 203 are formed at end portions thereof (see FIG. 10).

In more detail, the wiring patterns are perpendicular drawn out at both of the right-and-left sides in the array direction from a center of the LED light-emitting element 202. The bonding pads 203 are disposed as positions separate from the light-emitting area of the LED light-emitting element 202 by almost 300 µm. The bonding pads 203 are connected to the bonding pad 205 at the side of the base plate 204 with the bonding wire 206. Gold wire having a diameter of approximately 18 µm is used as the bonding wire 206.

Next, the minute reflection optical element array 211 manufactured as mentioned above is cut out in the state of a fancy paper strip, by a dicing-saw, so as to make the width thereof narrower than the distance between the bonding pads 203. The minute reflection optical elements array 211 is aligned with the LED light-emitting element 202 on the LED array chip 201 and bonded thereon with an adhesive agent, such as an ultraviolet-hardening resin. In Such a way, the LED array head 207 of the structure as shown in FIG. 7 may be completed.

In an example of a comparative structure, although the LED array head 207 is formed similar to that of the first concrete structure example, the head 207 has the background structure which does not include the minute reflection optical array 211. Furthermore, the comparative structure adopts the structure in which the position of the LED light-emitting element 202 and that of areas excluding the light-emitting area are respectively covered with black light-intercepting paints.

Using the LED array head in the first concrete structure example and the comparative structure example as mentioned above, an electrostatic latent image was formed on the surface of the photosensitive body 209. In addition, the toner was attached to the surface having the latent image formed thereon. Thereby, the latent image was developed to a visibly image. The quality of the developed image was evaluated as follows:

(1) The shape of the light-emitting layer area of the LED light-emitting elements 202 is preferably transferred and the unnecessary pattern does not occur at all. On this occasion, the result of the evaluation is "Good"

(2) The shape of the light-emitting layer area of the LED light-emitting element 202 is considerably deformed or distorted and the unnecessary pattern occurs. On this occasion, the result of the evaluation is "No Good."

In the above-mentioned first concrete structure example, even immediately after manufacturing the LED array head and even after performing an environmental test, the result of the evaluation was "Good". Here, the environmental test signifies the test of a temperature cycle (i.e., heat cycle) for reproducing a same state after using the head for a long time. On the contrary, in the above-mentioned comparative structure example, the result of the evaluation was "No Good" on all occasions.

According to the above-mentioned evaluation result, in the present embodiment, it is possible to realize the LED array head 207 which produces a quality image that is not lowered or deteriorated at all due to light reflected on the bonding wire 206 or the vacillating light (such as unnecessary light emitted from areas other than the light-emitting area), even with high resolution e.g., 600 dpi. Therefore, the performance efficiency can be maintained for a long time period. The above-mentioned matters were made clear by experiments performed by the inventors.

Furthermore, because the reflection layer 214 is formed on the surface of the opening portion 213, the amount of the light effectively directed to the equal-size focusing optical system 208 as incident light increases, and the amount or the exposure light for exposing the photosensitive body 209 also increases. Thereby, the speed of the writing operation is improved.

A second concrete structure example is described hereinafter. Using a soda glass base plate (optical element base plate 212) colored in dark brown with metallic salts, the same minute reflection optical element array 211 as that of the aforementioned first concrete structure example was manufactured. However, the reflection layer 214 was not formed in this example.

To determine the function of such a minute reflection optical element array 211, the light writing apparatus, as shown in FIG. 10, was manufactured. The equal-size focusing optical system 208, SLA12D made by Nihon Itagarasu Co., Ltd. was used.

Furthermore, regarding the LED array head 207, a gallium-arsenic crystal layer is grown on a silicon wafer base plate 204 by the heteroepitaxial method. Then, zinc (Zn) is diffused into the gallium-arsenic crystal layer for forming a POLYNUCLEOTIDE junction. The gallium-arsenic crystal layer is dry-etched by a chlorine gas. In addition, the patterning operation is performed so that square-pillar-shaped crystal layers are formed having a size of about 10 µm×10 µm with a pitch of about 40 µm (corresponding to 600 dpi). Thereby, a large number of LED light-emitting elements 202 may be formed in the state of an array.

Then, a silicon oxide film having a thickness of about 5000 Å is formed as the insulation film on the entire surface of the light-emitting elements. Thereby, a contact hole is formed. Then, a wiring pattern is formed with aluminum for the LED light-emitting elements 202, and bonding pads 203 are formed at end portions thereof (see FIG. 10).

In more detail, the wiring patterns are perpendicularly drawn out at both of the right-and-left sides in the array direction from a center of the LED light-emitting element 202. The bonding pads 203 are disposed at positions separate from the light-emitting area of the LED light-emitting element 202 by almost 300 µm. The bonding pads 203 are connected to the bonding pad 205 at the side of the base plate 204 with the bonding wire 206. Gold wire having a diameter of approximately 18 µm is used as the bonding wire 206.

Next, the minute reflection optical elements array 211 manufactured as mentioned above is cut out in the state of a fancy paper strip, by a dicing-saw, so as to make the width thereof narrower than the distance between the bonding pads 203. The minute reflection optical element array 211 is aligned with the LED light-emitting element 202 on the LED array chip 201 and bonded thereon with an adhesive agent, such as an ultraviolet-hardening resin. In such a way, the LED array head 207 of the structure as shown in FIG. 7 may be completed.

In an example of a comparative structure, although the LED array head 207 is formed similar to that of the second concrete structure example, the head 207 has the background structure which does not include the minute reflection optical array 211. Furthermore, the comparative structure adopts the structure in which the position of the LED light-emitting element 202 and that of areas excluding the light-emitting area are respectively covered with black light-intercepting paints.

Using the LED array head in the second concrete structure example and the comparative structure example as mentioned above, an electrostatic latent image was formed on the surface of the photosensitive body 209. In addition, toner was attached to the surface having the latent image formed thereon. Thereby, the latent image was developed to a visible image. The quality of the image thus developed was then evaluated.

In the above-mentioned second concrete structure example, even immediately after manufacturing the LED array head and even after performing the environmental test, the result or the evaluation was "Good." Here, the environmental test signifies the test of the temperature cycle (i.e., heat cycle) for reproducing a same state after using the head for a long time. On the contrary, in the above-mentioned comparative structure example, the result of the evaluation was "No Good" on all occasions.

According to the above-mentioned evaluation result, it is possible to realize the LED array head 207, which produces a quality image that is not lowered or deteriorated at all due to light reflected on the bonding wire 206 or the vacillating light (such as unnecessary light emitted from areas other than the light-emitting area), even with high resolution, e.g., 600 dpi. Therefore, the performance efficiency can be maintained for a long time period. The above-mentioned matters were made clear by the experiment performed by the inventors.

Furthermore, in the second concrete structure example, because the reflection layer 214 is not included in the head, the improvement of the writing speed may not be attained. However, because the reflection layer 214 is not formed, the head may be made at a further low cost, compared with the first concrete structure example.

Fourth Embodiment

The fourth embodiment according to the present invention will now be described with reference to FIG. 9. In the fourth embodiment, regarding the minute reflection optical element array 211, marginal escape recess portions 215 are formed on the surface of the optical element base plate 212 at the base plate 204. The marginal escape recess portions 215 are formed corresponding to a position and height, etc. of a wiring portion 216 so as to escape from the wiring portion 216 formed at the surface of the base plate 204.

The minute reflection optical elements array 211 is mounted on the base plate 204 at adequate intervals by the method of bonding with an adhesive agent, such as an ultraviolet hardening resin, etc. Then, according to the LED array head 207, the wiring portion 216 of the wiring pattern, etc. is provided in an asymmetrical shape on positions just adjacent to the light-emitting area of the LED light-emitting element 202, as shown in FIG. 9.

In such a situation, when the minute reflection optical element array 211 is mounted, there is a fear that a sharp step caused by the wiring portions may become an obstacle and a thickness of the adhesion layer increases. Therefore, the precision of the mounting position is lowered in the manufacturing process, and the time required for adjusting positions may become longer. Regarding this point, according to the present invention, since the marginal escape recess portion 215 is formed corresponding to the shape of the wiring portion 216, the minute reflection optical element array 211 can be practically mounted on the base plate 204 without being influenced by the wiring portion 216.

A third concrete structure example of the present embodiment is described hereinafter. In the structure example, regarding the minute reflection optical element array 211 in either one of the concrete structure examples according to the aforementioned embodiment, at first an etching mask is made by the photolithographic method (photolithography). Then, the marginal escape recess portion 215 corresponding to the wiring portion 216 are formed at a rear surface of the optical element base plate 212 by performing an etching operation with dilute fluoric acid. Thereafter, the same steps of the aforementioned concrete structure examples are performed in order.

Figure 9:
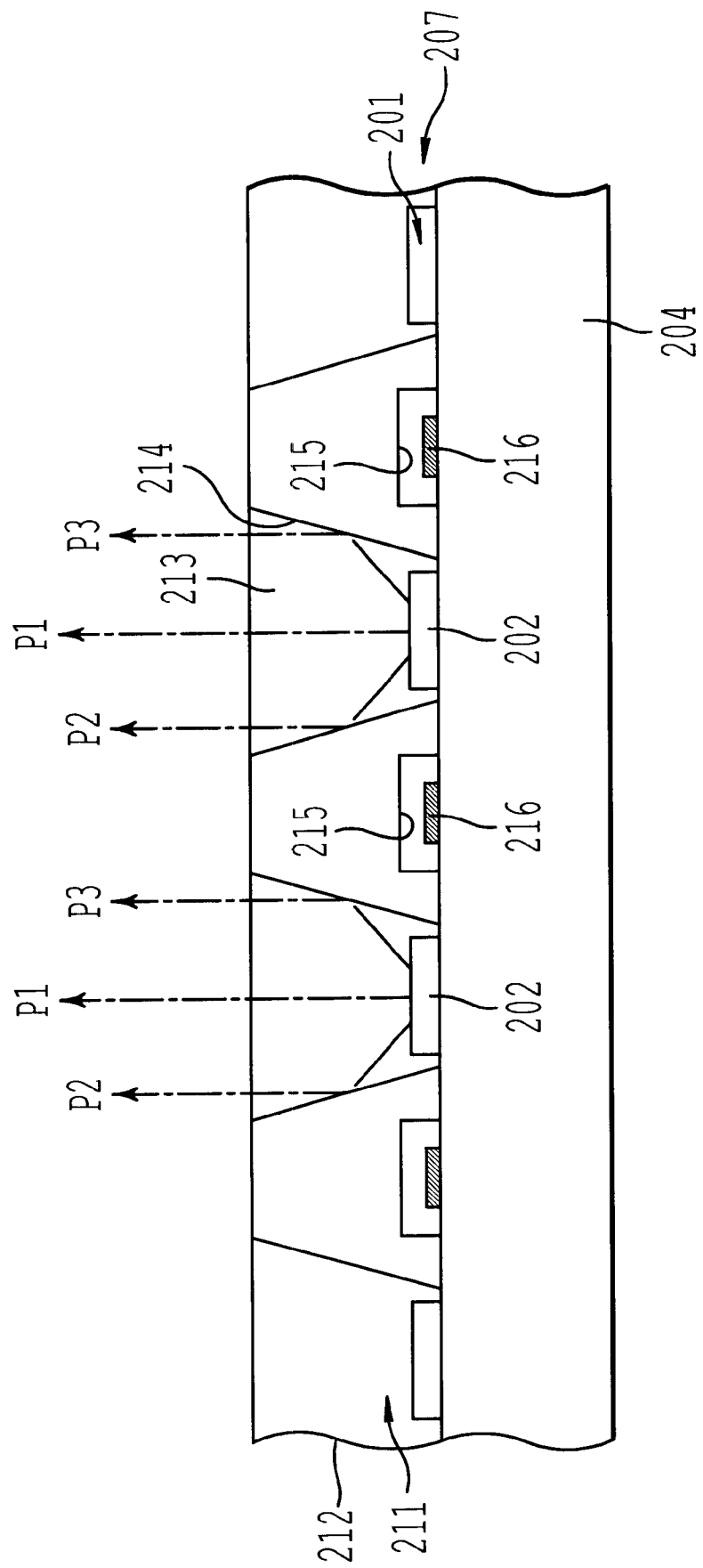
FIG. 9 is a perspective view showing a minute reflection optical elements array according to a fourth embodiment of the present invention.

According to the minute reflection optical element array 211 having a marginal escape recess portion 205, even in case that there exists a wiring portion 216 as shown in FIG. 9 in the LED array head 207, it is possible to practically mount the minute reflection optical elements array 211. Furthermore, the adjustment of positioning can be done in a short time and the increase of the. manufacturing cost can be suppressed.

As is apparent from the foregoing description of the embodiments according to the present invention, many advantageous functional effects mentioned below can be attained.

In the first aspect of the invention, because the LED array head includes a mirror array having reflection mirror structures formed and respectively corresponding to the upper circumferential surface of the respective LED lights emitting portions, the radiation angle thereof is narrowed. In such a structure, even though side-surface light is radiated in a direction of the array on the base plate surface (i.e., from the side surface of the protruding LED light-emitting portion), the light thus radiated is intercepted at a rear surface side of the respective reflection mirror structures between respective LED light-emitting portions. The light is thus reflected at the rear surface side of the reflection mirror structure to the surface of the base plate. Thereby, the light is not radiated outwards. Thus, the negative influence due to the side surface light can be suppressed. In addition, even though the radiation angle of the essential light emitted from the upper surface of the LED light-emitting portion is rattler wide, the essential light is reflected on the reflection mirror structure portion of the upper surface circumference and is radiated outwards. Consequently, the radiation angle is substantially narrowed, and thereby the efficiency of combining the light with the equal-size focusing optical system, etc. may be raised.

In the second aspect of the invention in connection with the first aspect, because the reflection mirror structures are formed in a shape of circular cone frustum, so that the upper surface ejection side has a diameter larger than a diameter of a lower surface, it is possible to simply and easily manufacture the reflection mirror structure which narrows the radiation angle, by etching, etc. and to ensure desirable functions.

In the third aspect of the invention, a minute reflection optical elements array is assembled in an optical writing apparatus provided with a light-emitting elements array. The light-emitting elements array includes plural light-emitting elements linearly formed on a base plate, the light emission of which is individually controlled. In addition, the reflection array is disposed at positions adjacent to the light-emitting elements array, and includes opening portions having a tapering cross-section shape. That is, a tapering cross-section shape which becomes narrower toward a surface of the base plate, so as to correspond to the respective light-emitting elements.

In such a structure, the essential light emitted from the respective light-emitting elements can be directed through the corresponding opening portions. In addition, even though there exists light coming from areas other than the essential light-emitting area, such light is reflected on surfaces of the opening portions. Thereby, the reflected light can be guided in the same direction as that of the essential light. Consequently, such light does not become irregular vacillating light. Thus, it is possible to prevent the negative influence exerted on the written image caused by the irregular light.

In the fourth aspect of the invention in connection with the third aspect, a marginal escape recess portion corresponding to a shape of a wiring portion on the light-emitting elements array is formed on a surface of the optical element base plate. In addition, a wiring pattern is disposed on positions just adjacent to the light-emitting areas. However, even in this case, the optical element array can be practically mounted and arranged on the light-emitting elements array, without being affected by the wiring portion.

In the fifth aspect of the invention in connection with the third or fourth aspects, a thin film or a substrate of the thin films is formed on the surface of the opening portions. In addition, the thin film includes a material selected from the group of aluminum, titanium, gold, silver, tungsten, nickel, and chromium.

Regarding light coming from areas other than the essential light-emitting area (i.e., due to reflection of light on side surfaces of the light-emitting elements array), such light can be surely and effectively guided in the same direction as that of the essential light by the reflection layer made of a predetermined material on the surface thereof (at the opening portions). Therefore, by effectively guiding the light to the equal-size focusing optical system, etc., the amount of the light for writing can be increased. Consequently, it is possible to realize a further high-speed writing operation. In addition, the amount of the written light increases and thereby the brightness of the image also increases. Therefore, it is possible to use the photosensitive body of a lower sensitivity. According to the present invention, the merits as mentioned heretofore can be attained.

Obviously, other numerous embodiments or numerous modifications of the present invention are possible in light of the above teachings. It is therefore to be understood that within the scope of the appended claims, the invention may be practiced otherwise than as specifically described herein.

Having now fully described the invention, it will be apparent to one of ordinary skill in the art that many changes and modifications can be made without departing from the spirit and scope of the invention as set forth. This application is based on Japanese Patent Application No. JPAP10-019, 11227, filed on Jan. 30, 1998; Japanese Patent Application No. JPAP10-042, 11203, filed on Feb. 24, 1998; and Japanese Patent Application No. JPAP10-031, 11065, filed on Feb. 13, 1998, the entire contents of each which are incorporated by reference.

What is claimed is:

1. An LED array head, comprising:
   a base plate;
   an array of protruding LED light-emitting portions formed on the base plate and configured to emit light in a first direction away from the base plate; and
   a mirror array including reflection mirror structures having front and rear surfaces and being formed on an upper circumferential surface of corresponding LED light-emitting portions, thereby reflecting light emitted by the LED light-emitting portions off the front surfaces of the reflection mirror structures so as to narrow a radiation angle of light emitted by the corresponding LED light-emitting portions,
   wherein the reflection mirror structures are arranged on the upper circumferential surface of the corresponding LED light-emitting portions such that unnecessary side surface light radiated from side surfaces of the corresponding LED light-emitting portions is reflected on the rear surfaces of the reflection mirror structures toward the base plate in a second direction which is substantially opposite to the first direction of light emitted by the LED light-emitting portions.

2. The LED array head as defined in claim 1, wherein the reflection mirror structures comprise a circular cone frustum shape having a diameter at an upper emission side larger than a diameter at a lower emission side.

3. A minute reflection optical elements array of an optical writing apparatus having an array of light-emitting elements formed on a base plate of an LED array head, comprising:
   opening portions having a tapering cross-section shape which becomes narrower in a direction toward the base plate at sides opposing corresponding light-emitting elements; and
   a thin reflection film formed on surfaces of the opening portions facing the corresponding light-emitting elements,
   wherein corresponding opening portions are disposed over the corresponding light emitting elements such that light emitted from an upper surface of the corresponding light emitting elements and having a large radiation angle first contacts the thin reflection film formed on the surfaces of the opening portions and is reflected in a substantially perpendicular direction away from the base plate.

4. The minute reflection optical elements array as defined in claim 3, further comprising:
   marginal escape recess portions formed at a surface of the optical elements array to be joined with a surface of the base plate of the array of light-emitting elements, said marginal escape recess portions have a shape corresponding to a shape of a wiring portion on the surface of the array of light-emitting elements at sides of the corresponding light-emitting elements.

5. The minute reflection optical elements array as defined in claim 3, wherein said thin reflection film includes a material selected from the group consisting of aluminum, titanium, gold, silver, tungsten, nickel, and chromium.

* * * * *